United States Patent [19]

Carey et al.

[11] Patent Number: 5,126,281
[45] Date of Patent: Jun. 30, 1992

[54] DIFFUSION USING A SOLID STATE SOURCE

[75] Inventors: Kent A. W. Carey, Palo Alto; James B. Williamson, Sunnyvale; Thomas S. Low, Santa Rosa; James S. C. Chang, Windsor, all of Calif.

[73] Assignee: Hewlett-Packard Company, Palo Alto, Calif.

[21] Appl. No.: 580,730

[22] Filed: Sep. 11, 1990

[51] Int. Cl.⁵ .................................................. H01L 31/00
[52] U.S. Cl. ............................... 437/161; 437/247; 437/987; 437/81; 148/33.2; 148/DIG. 15; 148/DIG. 37
[58] Field of Search .................. 148/DIG. 3, 4, 7, 15, 148/26, 30, 37, 38, 56, 65, 151, 33, 33.1, 33.2; 357/56; 437/81, 82, 89, 90, 99, 126, 129, 133, 160, 161, 168, 247, 942, 951, 987

[56] References Cited

U.S. PATENT DOCUMENTS

| | | | |
|---|---|---|---|
| 3,575,742 | 4/1971 | Gilbert | 437/161 |
| 3,615,938 | 10/1971 | Tsai | 437/161 |
| 3,767,484 | 10/1973 | Takagi et al. | 437/164 |
| 3,839,104 | 10/1974 | Yuan | 437/164 |
| 4,006,046 | 2/1977 | Pravin | 437/247 |
| 4,544,417 | 10/1985 | Clarke et al. | 437/247 |
| 4,661,177 | 4/1987 | Powell | 437/160 |
| 4,748,132 | 5/1988 | Fukuzawa et al. | 437/129 |
| 4,771,010 | 9/1988 | Epler et al. | 437/133 |
| 4,810,670 | 3/1989 | Furuyama et al. | 437/129 |
| 4,830,983 | 5/1989 | Thornton | 437/161 |
| 4,830,987 | 5/1989 | Miller et al. | 437/161 |
| 4,843,032 | 6/1989 | Tokuda et al. | 437/129 |
| 4,960,730 | 10/1990 | Kakimoto | 437/161 |
| 4,980,313 | 12/1990 | Takahashi | 437/129 |

FOREIGN PATENT DOCUMENTS

| | | | |
|---|---|---|---|
| 0315387 | 5/1989 | European Pat. Off. | 437/129 |
| 0103389 | 9/1978 | Japan | 437/160 |
| 0130567 | 8/1983 | Japan | 437/161 |
| 0194386 | 11/1983 | Japan | 437/129 |
| 0035426 | 2/1984 | Japan | 437/161 |
| 0074613 | 4/1985 | Japan | 437/161 |
| 0105224 | 6/1985 | Japan | 437/161 |
| 0255914 | 10/1988 | Japan | 437/161 |
| 2056773 | 3/1981 | United Kingdom | 437/161 |

OTHER PUBLICATIONS

S. K. Ghandhi, *VLSI Fabrication Principles*, John Wiley & Sons, 1983, pp. 180–182.
S. Wolf and R. N. Tauber, *Silicon Processing for the VLSI Era*, Lattice Press, vol. 1, 1986, pp. 262–263.
Enquist et al., Jour. Appl. Phys., vol. 63, (1988), pp. 4485–4493.
Enquist, Jour. of Crystal Growth, vol. 93, (1988), pp. 637–645.
Gallant et al., Appl. Phys. Lett., vol. 52, (1988), pp. 733–735.
Deppe, Appl. Phys. Lett., vol. 56, (1990), pp. 370–372.
Hobson et al., Appl. Phys. Lett., vol. 56, (1990), pp. 1251–1253.

*Primary Examiner*—Robert Kunemund

[57] ABSTRACT

Method for deposit of a p type dopant from a dopant layer into a predetermined region of a III-V semiconductor layer or multiple layers. The p type dopant is deposited in very high concentration in a semiconductor layer adjacent to the predetermined region. A second semiconductor layer, doped with a lower concentration of an n type dopant, is later deposited so that the high concentration p type dopant layer lies between the predetermined region and the n type dopant layer. The p type dopant is diffused into the predetermined region by thermally driven diffusion, which may be carried out at a lower temperature or for a shorter diffusion time interval than with conventional diffusion, and p type dopant diffusion may extend over greater distances.

20 Claims, 3 Drawing Sheets

DIFFUSION USING A SOLID STATE SOURCE

DESCRIPTION

1. Technical Field of the Invention

This invention relates to semiconductor fabrication, particularly to diffusion sources for dopants.

2. Background Art

The source for diffusion of dopants or dopant modifiers in semiconductor materials such as silicon, gallium arsenide and aluminum gallium arsenide is a fundamental choice in fabricating semiconductor integrated circuit structures. In some of these fabrications, parameters such as concentration and the relative increase or decrease in concentration of a dopant must be tightly controlled so that conventional diffusion sources, such as gas, liquid and chemical vapor deposition sources are of limited use.

Several workers have used deposits of dopants in a semiconductor layer as a diffusion source for circuit fabrication. Gilbert, in U.S. Pat. No. 3,575,742, discloses deposit of a doped p type semiconductor covering layer over an entire oxide surface, in which an aperture has been etched to expose part of a semiconductor substrate underneath. The structure is then heated to promote shallow diffusion of some of the p type dopant from the covering layer into a thin exposed surface region of the substrate. A central portion of the overlying p-doped semiconductor covering layer is etched away, and the remainder of the covering layer acts as a source for further diffusion of p type dopant into the substrate, thus forming a thicker diffused layer surrounding a shallow diffused area. The remaining p-doped covering layer is removed, deep diffusion is carried out using the diffused surface layer as a source, with heating to a high temperature, and an exposed layer of the substrate is re-oxidized. A central part of the exposed oxide layer is again etched away to expose the underlying semiconductor substrate, with the p type diffusion pattern therein, and n type dopant is deposited and diffused in a substrate region immediately below the exposed substrate surface.

In U.S. Pat. No. 3,615,938, Tsai discloses deposition of a dopant at a semiconductor surface, followed by deposition of an insulating covering layer to prevent outward diffusion of the dopant when the structure is heated to promote inward diffusion of the dopant. The insulating layer is silicon dioxide. A similar approach is disclosed by Takagi et al. in U.S. Pat. No. 3,767,484, except that the dopant is initially deposited as part of a doped oxide film that serves to suppress outward diffusion of the dopant when the structure is subsequently heated. Selective or patterned deposition of an oxide preventing film over the exposed surface allows control of relative inward and outward diffusion of the dopant.

Emitter push is a usually-deleterious effect whereby diffusion of a p type emitter dopant pushes an n type base dopant ahead of it, thereby precluding the fabrication of base regions of thickness smaller than about 0.4 μm. This effect is discussed by S. K. Ghandi in *VLSI Fabrication Principles*, John Wiley & Sons, 1983, pp. 180-182 and by S. Wolf and R. N. Tauber, *Silicon Processing for the VLSI Era*, Vol. 1, Lattice Press, 1986, pp. 262-263. A method of allegedly avoiding the emitter push effect is disclosed by Yuan in U.S. Pat. No. 3,839,104. This method includes formation of an oxide layer on an exposed semiconductor surface, formation of an aperture therein to re-expose a portion of the semiconductor surface, deposition of a dopant in a surface layer within the aperture, formation of a second oxide covering layer, and selective formation of windows or apertures in the second oxide to selectively enhance outward diffusion (as distinct from inward diffusion) of the dopant before a subsequent thermal drive diffusion step is performed.

Avoidance of emitter push in bipolar transistor fabrication is also disclosed by Pravin in U.S. Pat. No. 4,006,046, wherein an insulating layer is formed over selected portions of a surface containing a base dopant deposit before the base dopant is diffused throughout the designated base region. The emitter region is then doped in a portion of the surface that is not covered by the insulating layer, and the presence of the base dopant (of relatively high concentration) directly under the insulating layer limits lateral diffusion of the emitter dopant, as desired.

Enquist, Hutchby and de Lyon, in Jour. Appl. Phys. 63 (May 1988), pp. 4485-4493, have reported on the growth and diffusion of abrupt Zn profiles in undoped GaAs, Si-doped GaAs and heterojunction bipolar transistor (HBT) structures, and on concentration profiles at various depths in a semiconductor material. Abrupt turn-on during epitaxial growth of Zn doping to levels of the order of $10^{20}$ cm$^{-3}$, over distances of a few hundred Å or less, are achievable, but similarly abrupt turn-off of Zn doping is limited to about two orders of magnitude change in Zn concentration because of dopant tailing near the surface. Where the Zn is diffused inward from a given surface, the corresponding diffusion fronts of Zn are extremely sharp and the profile is not Gaussian. The depth of diffusion is significantly reduced when the semiconductor host material is adjacent to Si-doped GaAs, as opposed to being adjacent to undoped GaAs.

Enquist in Journal of Crystal Growth 93 (1988), pp. 637-645, has studied diffusion of Zn dopant in an HBT, with emitter layers including AlGaAs doped with Te, a base region including an undoped spacer layer of GaAs and a p layer of GaAs, and a collector region including an n collector layer of GaAs doped with Si and an n+ contact layer of GaAs doped with Te. The p type doping in the base region used Zn at a concentration of $5-20 \times 10^{19}$ cm$^{-3}$. Enquist noted that the addition of an contact layer as a part of the emitter region significantly enhanced the diffusion of Zn during epitaxial growth, as compared with similar growth in which the n type doping in the contact layer was omitted.

Gallant, Puetz, Zemel and Shepherd, in Appl. Phys. Lett. 52 (29 February 1988), pp. 733-735, reported that Zn-diffused in InP/InGaAs p-i-n photodiodes exhibit extremely low dark current and relatively low capacitance.

Deppe, in Appl. Phys. Lett. 56 (22 January 1990), pp. 370-372, has presented a model that attempts to explain the enhancement of Be or Zn diffusion that occurs in the HBT base in the presence of heavy n type doping in the HBT emitter contact layer. The model relies on Fermi level pinning at the crystal surface during epitaxial growth of the AlGaAs-GaAs crystal, which leads to an increased number of Ga interstitial defects in this material.

Hobson, Pearton, Jordan, in Appl. Phys. Lett. 56 (26 March 1990), pp. 1251-1253, have examined the diffusion of Zn in the base region of a GaAs-AlGaAs HBT structure, wherein the emitter, emitter contact and collector/subcollector layers are doped with Si or are undoped. No significant diffusion of Zn occurs where no Si doping is present. The addition of Si doping to the adjacent emitter and collector/subcollector layers causes substantial diffusion of Zn in the HBT base, as does Si doping of the GaAs emitter contact layer. Si counterdoping in the base region retards the Zn diffusion.

In these recent studies, the object is often to sharply limit the diffusion of a diffusant such as Zn to very small values in certain regions, for example, the extremely abrupt pn junction that is desired at the HBT emitter-base junction.

However, in other situations, it may be desirable to promote a controllable amount of diffusion of a p type dopant for purposes of localized doping of sub-regions in certain semiconductor devices.

What is needed is a technique to provide tightly controlled doping of a semiconductor with a dopant in a prescribed region and to selectively enhance diffusion of the dopant beyond the normal range throughout which the dopant would normally diffuse or at lower temperatures than would ordinarily promote significant diffusion.

SUMMARY OF THE INVENTION

These needs are met by a diffusion method that provides for deposit of a p type dopant in a predetermined region contiguous to a selected surface of a semiconductor material so that the contiguous region becomes a diffusion source. A thin insulating material is deposited on the selected surface adjacent to the predetermined region, and one or more apertures are etched in the material to expose a portion of the predetermined region. A p type dopant layer having a very high concentration is grown over the exposed portion of the selected surface. The semiconductor material is heated to a predetermined temperature to promote diffusion from the dopant layer into the semiconductor material within the predetermined region.

A covering layer of semiconductor material, doped with a selected concentration of an n type dopant, is optionally deposited over the p type dopant layer after the p type dopant has been deposited and before, or concurrent with, heating of the semiconductor material to promote diffusion of the p type dopant. The presence of the n type dopant within the covering layer causes the p type dopant to diffuse more strongly and over larger distances within the semiconductor material than would be the case with the n type dopant covering layer absent. The p type dopant and optional n type dopant may also be provided in a mesa structure contiguous to the predetermined region.

BEST MODE FOR CARRYING OUT THE INVENTION

Figure 1A:
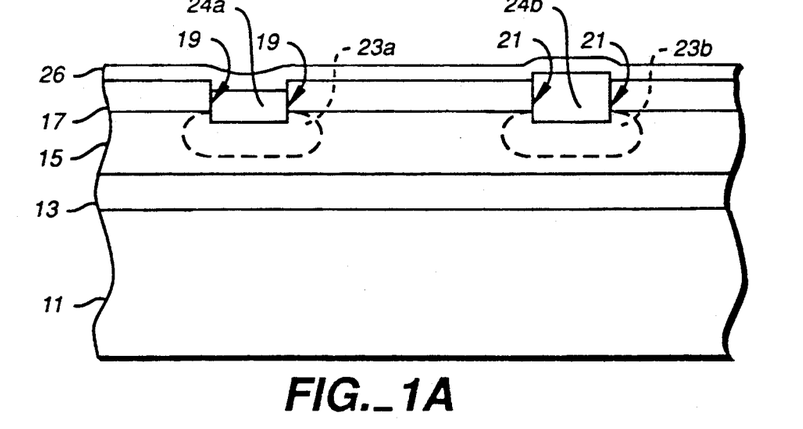
FIGS. 1A and 1B illustrate two embodiments of the invention, using isolated dopant layers and a continuous dopant layer, respectively.

With reference to FIG. 1A, a substrate or other underlayer 11 of semiconductor material is provided, with second and third layers 13 and 15 of semiconductor material being deposited on top of one another on the layer 11 as shown. A p type dopant is to be diffused within one or more predetermined diffusion regions 23a and 23b within the third layer 15 and contiguous to a selected exposed surface of the third layer 15. An insulating layer 17, such as $SiO_2$ or $Si_3N_4$, is deposited on the selected surface of the third layer 15, and one or more apertures 19 and 21 are etched in the insulating layer 17 in order to expose portions of the selected surface that are adjacent to the predetermined diffusion regions 23a and 23b. A semiconductor layer having at least one of two components 24a and 24b, which may be thick as shown or may be thin, having p type dopant therein, is deposited in the apertures 19 and 21, respectively, contiguous to the selected surface of the third layer 15. The dopant concentration in the p type dopant source layers 24a and 24b should be fairly high, ranging from $10^{17} cm^{-3}$ up to $10^{22} cm^{-3}$, depending upon the dopant concentration desired in the predetermined diffusion regions 23a and 23b and the size of each of these predetermined regions.

If, for example, the semiconductor materials used in the second and third layers 13 and 15 are III-V semiconductor materials such as GaInAs, a column II, p type dopant such as Be, Mg, Zn or Cd may be used, with a concentration of $10^{18} cm^{-3}$ or higher. The host material for the dopant source layers 24a and 24b may be a semiconductor material such as $Ga_xIn_{1-x}As$ ($0 \leq x \leq 1$).

After the dopant source layers 24a and 24b are deposited, the entire structure may be heated to a temperature of between 500° C. and 860° C. in order to drive the dopant into the third layer 15 within the respective predetermined regions 23a and 23b, with a concentration profile corresponding approximately to diffusion from a highly concentrated or a pure source (for example, a Gaussian).

The III-V compounds that make up the dopant source layers 24a and 24b may decompose due to loss of a volatile column 1, component during the thermal drive diffusion process. This loss may be suppressed or eliminated by use of an insulation layer 26, also shown in FIG. 1A, laid over the top of the dopant source layers 24a and 24b, or by pressing a wafer of the material that forms the third layer 15 against the exposed surfaces of the dopant source layers 24a and 24b. The wafer used for such purpose may also be represented by the layer 26 of material shown in FIG. 1A. An alternative means of suppressing or eliminating the loss of column V elements from the dopant source layers 24a and 24b during thermal drive diffusion is by providing a gaseous overpressure of the column V element or elements in the material or molecules containing these elements. The gas pressure should be greater than or of the order of the maximum vapor pressure of the column V component or components in the dopant source layers 24a and 24b for the range of temperatures to be used for the thermal drive diffusion process.

Figure 1B:
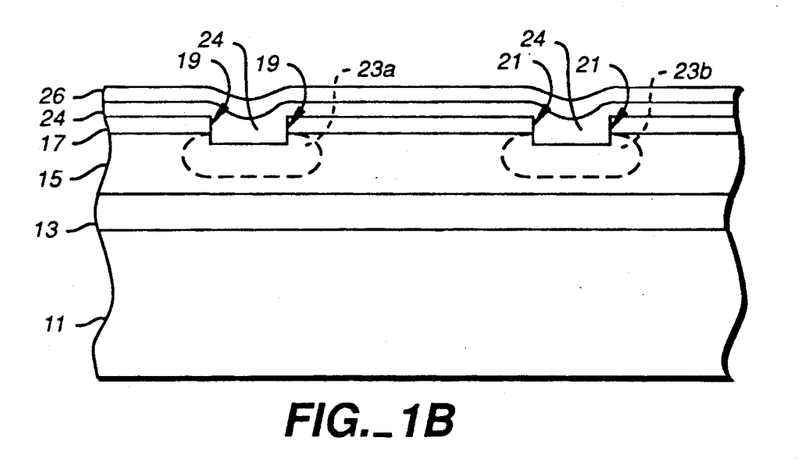

In FIG. 1A, the dopant layers 24a and 24b are deposited in and defined by the apertures 19 and 21, respectively, so that the dopant layers 24a and 24b are isolated from one another. In an alternative embodiment shown in FIG. 1B, a single dopant layer 24 fills the bottoms of the apertures 19 and 21 and overlies the insulating layer 17 as shown. This dopant layer 24 replaces the two isolated dopant layers 24a and 24b, and the insulation layer 26 is deposited over the layer 24 as in FIG. 1B.

Figure 2A:
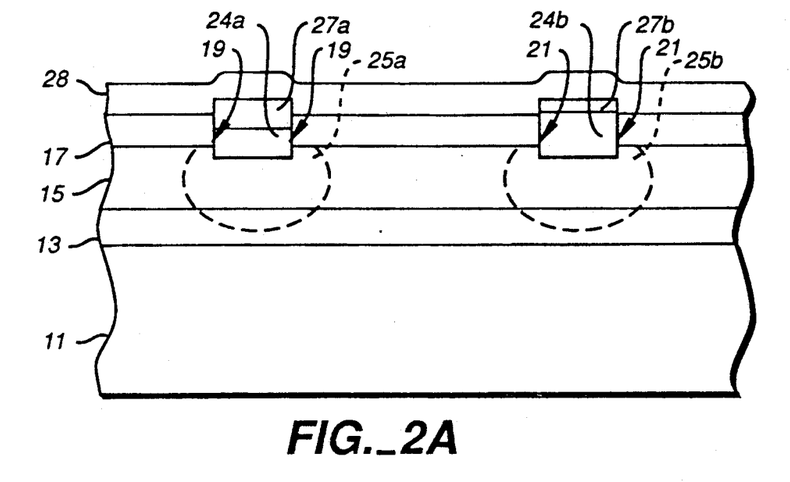
FIGS. 2A and 2B illustrate two other embodiments of the invention, using isolated dopant layers and a continuous dopant layer, respectively, where the dopant diffuses across more than one semiconductor layer.
Figure 2B:
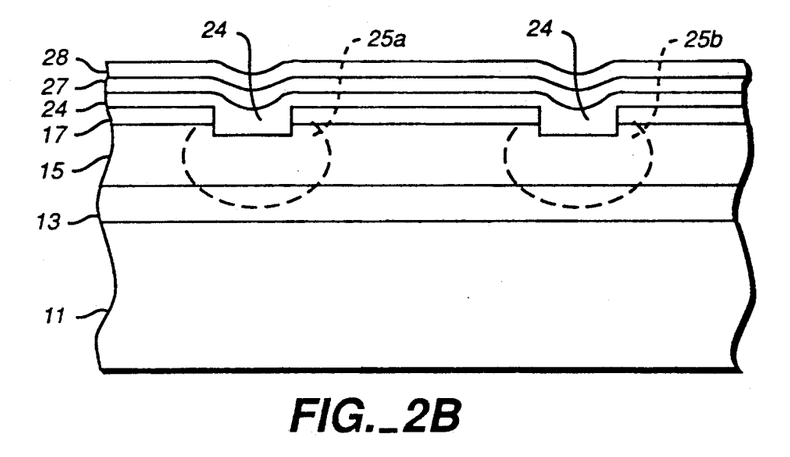

If the third layer 15 is very thick, or if the predetermined regions (now designated 25a and 25b) extend through more than one semiconductor layer, as illustrated in FIGS. 2A and 2B, thermal drive diffusion of the deposited dopant may need to be enhanced. In another embodiment, illustrated in FIG. 2A, after the apertures 19 and 21 are etched in the insulating layer 17, semiconductor cap layers 27a and 27b are deposited over the top of the p dopant source layers 24a and 24b, respectively, grown in the apertures 19 and 21 in the insulating layer 17. The material used for these cap layers 27a and 27b is doped to a low or modest concentration with n type dopant. The dopant concentration in the semiconductor layers 27a and 27b may be between $10^{16} cm^{-3}$ and $10^{21} cm^{-3}$. We have discovered that deposit of a semiconductor layer or layers 27a and 27b, doped with n type dopant of modest concentration, contiguous to a p type dopant source layer such as 24a or 24b, will enhance thermally-driven diffusion of the p type dopant into and through a semiconductor layer such as 15 and can cause a portion of this dopant to diffuse through one or more other semiconductor layers, such as 13, that are positioned at some distance from the original dopant source layer. The predetermined diffusion regions 25a and 25b to be doped may now extend across the third semiconductor layer 15 and include a portion of or all of the second semiconductor layer 13, if desired.

In FIG. 2B, the isolated p type dopant layers 24a and 24b of FIG. 2A, positioned at the bottoms of the respective apertures 19 and 21, are replaced by a single dopant layer 24 that fills the bottoms of these apertures, overlies the insulating layer 17, and underlies a continuous n type cap layer 27 that also extends across the entire structure.

A second insulating layer or wafer layer 28, shown in FIGS. 2A and 2B, may optionally be added to these configurations to suppress or eliminate the loss of the column V element or elements from the cap layer 27 (FIG. 2B) or cap layers 27a and 27b (FIG. 2A) during the thermal drive diffusion process. Alternatively, a gas atmosphere of the semiconductor and/or dopant materials used in the cap layer 27 (FIG. 2B) or cap layers 27a and 27b (FIG. 2A) can be provided above the structures shown in FIGS. 2A and 2B (with the second insulating layer 28 removed) at a pressure greater than the maximum vapor pressure of material in the cap layer or layers. This approach to column V element loss suppression is analogous to that discussed in connection with FIGS. 1A and 1B.

Figure 3:
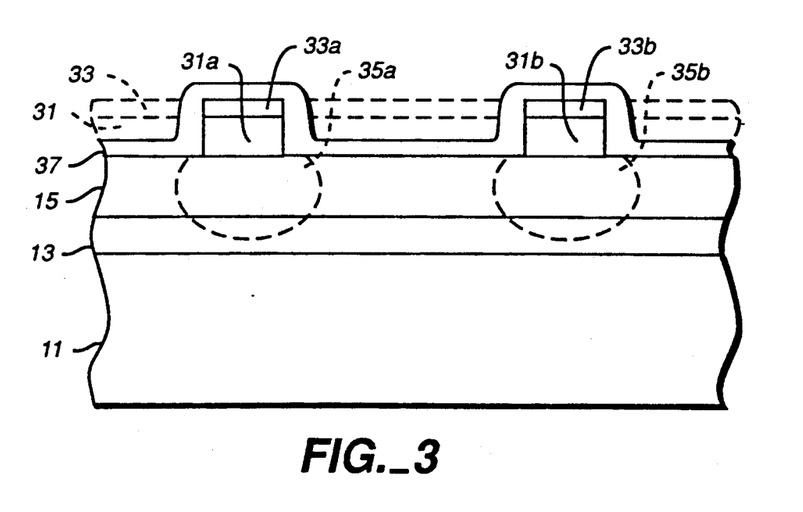
FIGS. 3 and 4 illustrate two embodiments of a mesa configuration according to the invention.

FIG. 3 illustrates another embodiment of the invention, in which a fourth layer 31 of semiconductor material, highly doped with p type dopant, is deposited on the exposed surface of the third semiconductor layer 15. A fifth semiconductor layer 33 (optional) that is less highly doped with n type dopant is deposited on the exposed surface of the fourth layer 31, and the fourth and fifth layers 31 and 33 are etched away to leave one or more mesas 31a–33a and 31b–33b having two layers of doped semiconductor material as shown. The mesa components 31a and 31b then serve as dopant sources for a thermal drive process that ultimately deposits the p type dopant throughout predetermined regions 35a and 35b, respectively, that may extend across the third semiconductor layer 15 and extend across part or all of the second semiconductor layer 13, if desired. The presence of the moderately doped semiconductor cap layers 33a and 33b with n type dopant helps to promote diffusion of the p type dopant from the mesa components 31a and 31b within the predetermined regions 35a and 35b. The above discussed approach may be applied here through deposit of an insulating layer 37 (optional) to cover the cap layers 33a and 33b of the dopant source mesa layers 31a and 31b, or through use of an overlying gas atmosphere as discussed above.

Figure 4:
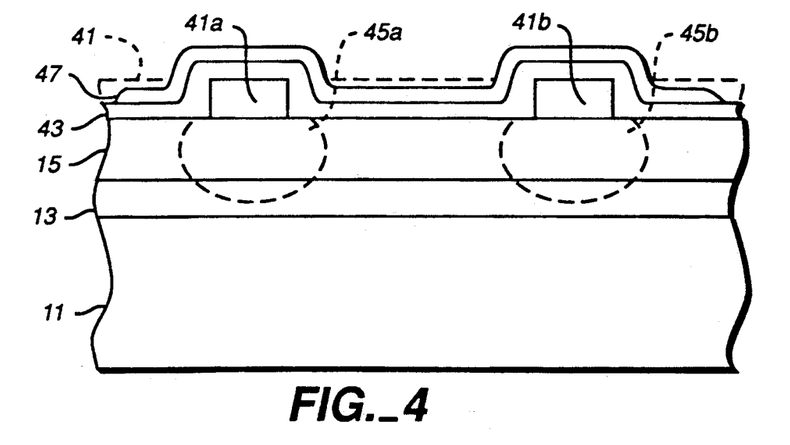

FIG. 4 illustrates another embodiment of the invention. A fourth semiconductor layer 41, highly doped with a p type dopant, is deposited on the exposed surface of the third semiconductor layer 15, and one or more mesas 41a and 41b of this material are formed by etching away most of this layer 41 to leave the mesas as shown. A fifth semiconductor layer 43, doped with a selected concentration of n type dopant, is deposited as a cap layer on the remainder of the exposed surface of the third layer 15 and the exposed surfaces of the mesas 41a and 41b. The cap layer 43 serves the same purpose relative to the mesas 41a and 41b in FIG. 4 as do the cap layers 33a and 33b relative to the mesas 31a and 31b shown in FIG. 3. Thermally-driven diffusion of the p type dopant contained in the mesas 41a and 41b is enhanced by the presence of the n type cap layer 43, and the predetermined regions 45a and 45b for diffusion of the p type dopant can extend through the third semiconductor layer 15 and through a portion or all of the semiconductor layer 13, if desired. The above discussed approach includes deposit of an insulating layer 47 (optional) to cover the cap layer 43, or through use of an overlying high pressure gas atmosphere as discussed above.

Figure 5:
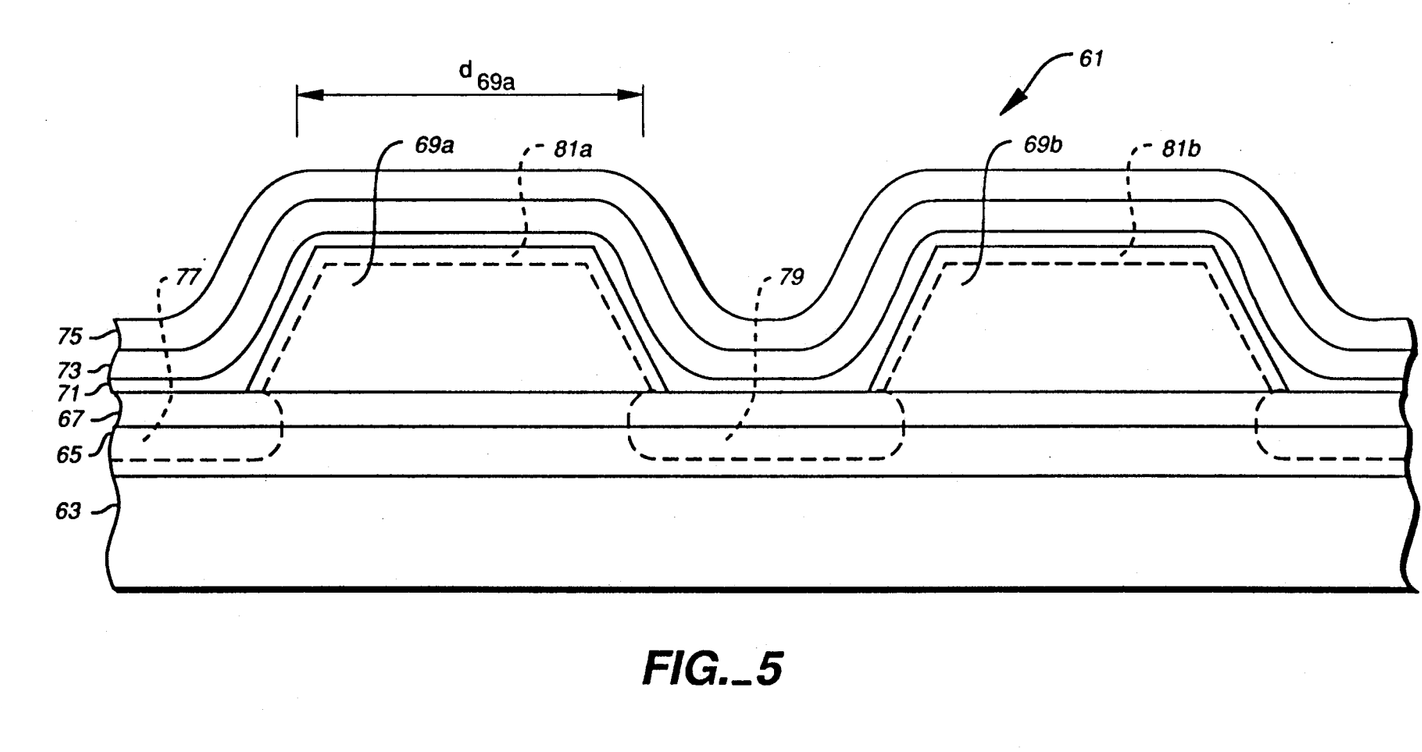
FIG. 5 illustrates application of the invention to control of lateral and longitudinal diffusion in an IC structure.

FIG. 5 illustrates the application of the above-discussed technology to control of lateral and longitudinal diffusion in fabrication of an IC structure 61. A substrate 63 has second and third overlying semiconductor layers 65 and 67, respectively, provided, which may be $n^+$-doped InP and n-doped InP, respectively. Two or more adjacent but spaced apart mesas 69a and 69b of a different semiconductor material such as GaInAs are etched from layers deposited on top of the third layer 67, and a thin etch stop layer 71, such as InP (optional) and a heavily doped p type dopant source layer 73 such as GaInAs is deposited on the exposed surfaces of the third layer 67 and on the mesas 69a and 69b. An n type dopant cap layer 75 is deposited over the p type dopant source layer 73. The p type dopant contained in the dopant source layer 73 is thermally driven into and/or through the third layer 67, and possibly into and/or through the second layer 65, by diffusion and forms predetermined diffusion regions 77 and 79 that are spaced apart from one another and are each adjacent to a side wall of one of the mesas 69a. The surfaces of the mesas 69a and 69b will also be diffused with thin layers 81a and 81b, respectively, of this p type dopant. The diffusion regions 77 and 79 and the thin layers 81a and 81b may all be connected, as shown in FIG. 5. The two diffusion regions 77 and 79 are spaced apart from one another by a controllable, non-zero distance $d_{69a}$. This diffused structure can be used to form devices (1) by using the doped regions 77 and 79 and removing the mesas 69a and 69b and the layers 71, 73 and 75, or (2) by using the mesas 69a and 69b and removing the layers 73 and 75 and using a selective etch to remove layer 71 and cut through the doped regions 77 and 79.

By using a semiconductor layer that is highly doped as the source of dopant impurities, the diffusion of the selected dopant is more easily controlled than in diffusion from a vapor, liquid or non-semiconductor solid source as used in the prior art. This technique allows lateral definition of doped regions without the need for use of dielectric or other insulating films. Further, surface oxides and other contaminants that could interfere with reproducible dopant diffusion will generally not be present because the dopant source can be integrated into growth of an adjacent semiconductor layer such as an epitaxial layer. For example, in an InP/GaInAs structure, a highly doped p type GaInAs layer, with a dopant such as Be, Mg, Zn or Cd, could be deposited on top of n type GaInAs and on top of n type InP layers. Lateral diffusion or definition of the predetermined region is controlled by selective etching so that the source of the dopant extends over a controllable and limited portion of the exposed surface that is contiguous to the predetermined region. The highly doped p type layer that is the source of dopant for the diffusion is now heated to promote diffusion of the dopant both vertically and, to a lesser extent, horizontally to define the predetermined regions. The result of this method is a semiconductor structure that is highly and controllably doped in a vertical direction and is modestly doped laterally.

With reference to the embodiments shown in FIGS. 2, 3, 4 and 5, using a combination of a highly doped p type first layer contiguous to a second, selectively doped n type layer to control diffusion in compound semiconductor structures has several advantages over conventional methods. First, improved control of the transport parameters that are critical to diffusion is available, as is the ability to pattern the diffusion source(s) using standard processing techniques. Further, diffusion can take place at lower temperatures than where corresponding conventional methods are used, because of the enhanced p type dopant diffusion, which is promoted by presence of the doped n type semiconductor cap. The highly doped diffusion sources may be patterned before diffusion to define the device geometry, with fairly tight control being available over the size and placement of these patterns. Heat treatment to activate the diffusion from the deposited source may be done during growth of the doped layer(s) or may be done in a subsequent heat treatment as discussed. The remainder of the highly doped layers may be removed after diffusion is complete or may be retained as part of the device structure.

Where a III-V semiconductor compound is used as host for diffusion of p type impurities from a column II element such as Be, Mg, Zn or Cd, following the deposit of a p type diffusion source capped with an n type covering layer, the diffusion of the p dopant occurs at lower temperatures and in shorter times than if the n type cap layer is not present. Lower temperature processes are desirable here in order to minimize surface degradation due to loss of column V elements such as P, As or Sb, and to reduce the effects of heat treatment on other adjacent junctions and devices in the circuit. The presence of an n type cap layer also increases the strength of diffusion during subsequent heat treatments so that, if low temperature growth is performed in order to inhibit initial diffusion, a subsequent high temperature heat treatment may be used to activate the diffusion layer at a later time.

Activation of the source layer of the dopant to promote diffusion could even be performed after all other parts of the device geometry are in place so that the dopant source laser acts as a buried layer source of dopant diffusion. This buried layer would lie more or less dormant while a sequence of low temperature processes are used to deposit various parts of the device in layers that lie above the buried layer. At an appropriate time, the temperature of the structure could be raised above a threshold temperature $T_{thr}$ to vigorously promote diffusion from the buried layer to define one or more predetermined regions in the interior of the structure where doping to a predetermined strength is desired.

We claim:

1. A method for deposition of a selected p type dopant in two designated regions contiguous to a selected surface of a column III-column V semiconductor material, the method comprising the steps of:

forming first, second and third mesas of a second semiconductor material covering portions of the selected surface, the mesas being adjacent to one another but spaced apart by selected distances so that portions of the selected surface are exposed contiguous to the designated regions and so that the second mesa is positioned approximately between the first and third mesas;

depositing a dopant source layer on the exposed surfaces of the mesas and of the selected surface, where the dopant source layer material includes a semiconductor material doped with the selected p type dopant and having a dopant concentration in the range $10^{17}$ cm$^{-3}$ to $10^{21}$ cm$^{-3}$;

depositing a covering layer on the dopant source layer, where the covering layer material includes a semiconductor material doped with an n type dopant and having a dopant concentration in the range $10^{16}$ cm$^{-3}$ to $10^{21}$ cm$^{-3}$; and heating the dopant source layer to a selected temperature T in the range of $500°$ C. $\leq T \leq 860°$ C. for a selected time interval, and allowing the selected dopant to diffuse into the semiconductor in the designated regions and away from the covering layer.

2. A method for deposition of a selected dopant in a designated region of a column III-column V semiconductor material contiguous to a selected surface of the semiconductor material, the method comprising the steps of:

depositing a layer of insulating material on the selected surface of the semiconductor material adjacent to the designated region;

forming at least one aperture in the insulating material to expose a portion of the selected surface that is contiguous to the designated region;

growing a p type dopant source layer of column III-column V semiconductor material having a p type dopant concentration in the range $10^{17}-10^{21}$ cm$^{-3}$ over the exposed portion of the selected surface;

depositing a covering layer, including a column III-column V semiconductor material and doped with an n type dopant having a concentration in the range of $10^{16}-10^{21}$ cm$^{-3}$, contiguous to a portion of the dopant source layer and spaced apart from the selected surface; and heating the dopant source layer to a selected temperature T in the range 500°-860° C. for a selected time interval, and allowing the p type dopant in the dopant source layer to diffuse, in a direction away from the covering layer, and into the designated region.

3. The method of claim 2, further comprising the step of also growing said p type dopant source layer over at least a portion of said thin insulating layer, at the time said p type dopant source layer is grown over said exposed portion of said selected surface.

4. The method of claim 2, further comprising the step of choosing said semiconductor material as $Ga_xIn_{1-x}As$ for some value of x between 0 to 1.

5. The method of claim 2, further comprising the step of providing said p type dopant at a concentration of between $10^{17}$ cm$^{-3}$ and $10^{22}$ cm$^{-3}$ in said surface layer.

6. The method of claim 4, further comprising the steps of:
choosing said p type dopant from the class of p type dopants consisting of Be, Mg, Zn and Cd; and
choosing said n type dopant from the class of n type dopants consisting of Si, Ge, Sn, S, Se and Te.

7. The method of claim 2, further comprising the step of depositing an insulating layer over said covering layer to suppress loss of column V elements when said dopant source layer is heated.

8. The method of claim 2, further comprising the step of positioning a layer of semiconductor material contiguous to an exposed surface of said covering layer to suppress loss of column V elements when said dopant source layer is heated.

9. The method of claim 2 further comprising the step of providing, above said covering layer, a gas containing the column V elements contained in said covering layer and having a gas pressure at least equal to the maximum vapor pressure attained by the column V elements in said covering layer when said dopant source layer is heated.

10. The method of claim 2, further comprising the step of choosing said temperature T to be between 500° C. and 860° C.

11. A method for deposition of a selected dopant in a designated region of a column III-column V semiconductor material contiguous to a selected surface of the semiconductor material, the method comprising the steps of:
depositing a dopant source layer, containing a p type dopant with a dopant concentration in the range $10^{17}-10^{21}$ cm$^{-3}$, in a column III-column V semiconductor material, on the selected surface;
removing portions of the dopant source layer to expose portions of the selected surface and to form at least one mesa on the selected surface adjacent to the designated region, the mesa having a mesa top surface spaced apart from the selected surface;
depositing a covering layer of column III-column V semiconductor material doped with an n type dopant having a concentration in the range of $10^{16}-10^{21}$ cm$^{-1}$, contiguous to the top surface of the mesa; and
heating the semiconductor material to a selected temperature T in the range 500°-860° C. for a selected time interval, and allowing the p type dopant in the dopant source layer to diffuse, in a direction away from the covering layer and toward the selected surface, into the semiconductor material within the designated region.

12. The method of claim 2, further comprising the step of also depositing said covering layer on at least a portion of said selected surface not covered by said mesa.

13. The method of claim 11, further comprising the step of depositing an insulating layer over said covering layer to suppress loss of column V elements when said mesa is heated.

14. The method of claim 12, further comprising the step of depositing an insulating layer over said covering layer to suppress loss of column V elements when said mesa is heated.

15. The method of claim 11, further comprising the step of positioning a layer of semiconductor material above said selected surface and said mesa, to suppress loss of column V elements when said mesa is heated.

16. The method of claim 11 further comprising the step of providing above said selected surface, a gas containing said column III-column V material contained in said covering layer and having a gas pressure at least equal to the maximum vapor pressure attained by said column V elements in said covering layer when said mesa is heated.

17. The method of claim 11, further comprising the step of choosing said temperature T to be between 500° C. and 860° C.

18. A method for deposition of a selected p type dopant in a designed region in the interior of a semiconductor material that has several layers, the method comprising the steps of:
depositing a first layer of column III-column V semiconductor material adjacent to the designated region;
depositing a p type dopant in the first layer, where the p type dopant is chosen so that diffusion thereof is minimal until a threshold temperature $T_{thr}$ is exceeded;
depositing a second layer, of column III-column V semiconductor material that is heavily doped with an n type dopant, contiguous to and over the first layer so that the first layer lies between the second layer and the designated region, where deposition of this second layer is carried out at a temperature that is substantially less than $T_{thr}$; and
heating the first and second layers to a temperature $T > T_{thr}$ and allowing the p type dopant to diffuse toward and within the designated region and away from the second layer.

19. The method of claim 18, further comprising the step of choosing said temperature T to be between 500° C. and 860° C.

20. A method for deposition of a selected p type dopant in a designated region contiguous to a selected surface of a column III-column V semiconductor material, the method being characterized by the steps of:
forming first and second mesas of a second semiconductor material covering portions of the selected surface, the mesas being adjacent to one another but spaced apart by a selected distance sot hat portions of the selected surface are exposed contiguous to the designated region;
depositing a dopant source layer on the exposed surface of the mesas and the selected surface, where the dopant source layer material includes a semiconductor material doped with the selected p type dopant and having a dopant concentration in the range $10^{17}-10^{21}$ cm$^{-3}$.

depositing a covering layer on the dopant source layer contiguous to the dopant source layer, where the covering layer includes a semiconductor material doped with an n type dopant and having a dopant concentration in the range $10^{16}$–$10^{21}$ cm$^{-3}$; and heating the dopant source layer to a selected temperature T between 500° C. and 860° for a selected time interval. and allowing the selected p type dopant to diffuse into the designated region and away from the covering layer.

* * * * *

UNITED STATES PATENT AND TRADEMARK OFFICE
CERTIFICATE OF CORRECTION

PATENT NO. : 5,126,281

DATED : June 30, 1992

INVENTOR(S) : Kent A.W. Carey et al.

It is certified that error appears in the above-identified patent and that said Letters Patent is hereby corrected as shown below:

Column 4, line 46, "column 1, component" should read -- column V component --;

Signed and Sealed this

Tenth Day of August, 1993

Attest:

MICHAEL K. KIRK

Attesting Officer

Acting Commissioner of Patents and Trademarks